(12) United States Patent
Radahl

(10) Patent No.: US 7,109,510 B2
(45) Date of Patent: Sep. 19, 2006

(54) METHOD AND APPARATUS FOR ALIGNING A SUBSTRATE ON A STAGE

(75) Inventor: Simon Radahl, Lidingö (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 11/061,646

(22) Filed: Feb. 22, 2005

(65) Prior Publication Data

US 2005/0156122 A1    Jul. 21, 2005

Related U.S. Application Data

(63) Continuation of application No. PCT/SE03/01260, filed on Aug. 11, 2003.

(30) Foreign Application Priority Data

Aug. 23, 2002   (SE)  .................................. 0202505

(51) Int. Cl.
  *G01N 21/86*   (2006.01)

(52) U.S. Cl. ............................. 250/559.3; 250/559.33; 901/47

(58) Field of Classification Search ............ 250/559.3, 250/559.36, 559.33; 356/622, 399, 400, 356/141.1, 141.2, 601; 901/46, 47; 33/286; 414/936, 937, 939, 940, 941
See application file for complete search history.

(56) References Cited

U.S. PATENT DOCUMENTS

| | | | |
|---|---|---|---|
| 5,783,834 A * | 7/1998 | Shatas | 250/559.33 |
| 6,226,087 B1 | 5/2001 | Blaesing-Bangert | |
| 6,342,705 B1 * | 1/2002 | Li et al. | 250/559.4 |
| 6,624,433 B1 * | 9/2003 | Okumura et al. | 356/620 |
| 6,806,484 B1 * | 10/2004 | Steketee et al. | 250/559.36 |
| 2001/0017939 A1 | 8/2001 | Yoshida | |

* cited by examiner

*Primary Examiner*—Georgia Epps
*Assistant Examiner*—Don Williams
(74) *Attorney, Agent, or Firm*—Harness, Dickey & Pierce, P.L.C.

(57) ABSTRACT

A method for aligning a workpiece may include determining a first and second position of a first edge of the workpiece based on a first and a second position of a pickup device. The workpiece may be aligned based on the first and second position of the pickup device. The at least first and second positions of the pickup device may be determined based on an intersection of a laser beam and the workpiece.

28 Claims, 3 Drawing Sheets

METHOD AND APPARATUS FOR ALIGNING A SUBSTRATE ON A STAGE

PRIORITY STATEMENT

This application is a continuation under 35 U.S.C. § 111(a) of PCT International Application No. PCT/SE2003/001260 which has an international filing date of Aug. 11, 2003, which designated the United States of America, and which claims priority under 35 U.S.C. § 119 of Swedish Patent Applicant No. 0202505-4, filed on Aug. 23, 2002, the entire contents of both of which are hereby incorporated by reference.

TECHNICAL FIELD

The present invention relates to lithography and lithographic processes.

BACKGROUND OF THE INVENTION

In order to pattern a workpiece in, for example, a lithographic process, using either lasers, electron beams, ions or other methods, the workpiece may be aligned with a writing tool in, for example, six different ways. The workpiece may be horizontally aligned with the writing tool in an x-direction and in a y-direction. The workpiece may also be aligned, for example, rotationally aligned. The workpiece may be placed in focus of the writing tool, that is, be aligned in a z-direction. The workpiece and writing tool may be tilt aligned in, for example, two perpendicular directions. The workpiece and the writing tool may not be tilt aligned, and the pattern created by the writing tool may be out of focus for different parts of the workpiece and in focus for other parts.

The alignment of the workpiece in the x-direction, y-direction and the rotational alignment may be performed by placing the workpiece in a pre-aligner, which may include a number of alignment pegs extending from a surface on top of which said workpiece may be replaced. The alignment pegs may be attached to the surface of the pre-aligner for aligning the workpiece in a position. The pre-aligner may blow air through a number of orifices beneath the workpiece, and a cushion may be formed between the surface of the pre aligner and the workpiece. The cushion may transport the workpiece in a direction with a reduced amount of friction and/or force applied. If the pre-aligner is tilted in a direction so that the alignment pegs may be lowered, the workpiece may move towards the alignment pegs. If the alignment pegs are attached to the surface correctly, the workpiece may be placed in the position when contacting the alignment pegs. A gripper may grip the workpiece in a position and may transport the workpiece to a stage for further alignment.

Another conventional method for aligning the workpiece may use a stage, which may be movable in both the x- and y-direction and rotatable along a central axis. The workpiece may be placed, within tolerances, at the stage. A detector may detect the position of the edges of the workpiece while moving the stage. The stage may be in an aligned position, for example, when the actual position of the edges of the workpiece may be in a position.

SUMMARY OF THE INVENTION

Example embodiments of the present invention provide methods and an apparatus for aligning a workpiece.

In an example embodiment of the present invention, a first and second position of a first edge of the workpiece may be determined based on a first and a second position of a pickup device. The positions of the pickup device may be determined based on intersections of a laser beam and the workpiece. The workpiece may be aligned based on the first and second positions of the pickup device.

In another example embodiment of the present invention, a first and second position of a first edge of the workpiece may be determined based on a first and a second position of a pickup device, and a first position of a second edge of the workpiece may be determined based on a third position of the pickup device. The first, second, and third positions of the pickup device may be determined based on intersections of a laser beam and the workpiece, and the workpiece may be aligned based on the first, second, and third positions of the pickup device.

In another example embodiment of the present invention, a workpiece may be fetched and rotationally aligned in a plane of a surface of the workpiece. The workpiece may be arranged on a stage, and aligned in at least one of an x and y direction.

In another example embodiment of the present invention, an apparatus for aligning a workpiece may include a laser adapted to irradiate the laser beam, a detector for detecting when positions of at least one edge of the workpiece is at least partially intersecting the laser beam, and a robotic arm for moving the workpiece in at least one direction and placing the workpiece on a stage. A computer may register positions of the robotic arm when the positions of the at least one edge of the workpiece at least partially intersect the laser beam, compute an angle error of the workpiece based on registered positions of the robotic arm, correct the angle error of the workpiece using the robotic arm, and compute a position of the stage based on the registered positions of the robotic arm.

In example embodiments of the present invention, a workpiece may be fetched, moved in a first direction toward the laser beam, the position of the pickup device when the first edge of the workpiece is at least partly breaking the laser beam may be registered.

In example embodiments of the present invention the workpiece may be displaced and moved in a direction toward the laser beam. A detector may detect when the second edge of the workpiece is at least partly breaking the laser beam, and the position of the pickup device may be registered.

In example embodiments of the present invention, an angle error of the workpiece may be computed based on the at least first second and third positions. The angle error of the workpiece may be corrected and the workpiece may be placed onto a stage.

In example embodiments of the present invention, the workpiece may be aligned in at least one of an x and y direction while being arranged on a stage. The alignment of the workpiece in at least one of the x and y direction may be performed by detecting a position of the workpiece using a camera and moving the workpiece into a position using the stage.

In example embodiments of the present invention, the positions of the first edge and the second edge may be determined by detecting an edge using an edge detector, while the workpiece may be supported by a stage and moving the workpiece into a position using the stage.

In example embodiments of the present invention, the edge detection may be performed using a detector which may be capable of detecting a change in property of a reflected laser beam when passing at least one of the first and second edges, while the workpiece may be supported by the stage.

In example embodiments of the present invention, the stage may be movable in at least one of an x and y direction.

In example embodiments of the present invention, the workpiece may be rotated and the workpiece may be moved in a second direction toward the laser beam. A detector may detect when the first position of a second edge of the workpiece may be at least partially intersecting the laser beam, and the position of the robotic arm may be registered.

In example embodiments of the present invention, a position of the first edge may be computed, an angle error of the workpiece may be corrected, a position of the second edge may be computed, and the workpiece may be placed onto a stage with the first and second edges at positions.

In example embodiments of the present invention, the laser beam may have a wavelength, which may not affect material sensitive to electromagnetic radiation. In example embodiments of the present invention, the workpiece may be rotated 90°.

In example embodiments of the present invention, the rotational alignment may be performed by detecting two spaced apart positions on a common edge.

In example embodiments of the present invention, the position of the edge may be determined based on the detected two positions prior to arranging the workpiece on the stage.

In example embodiments of the present invention, a position of another edge of the workpiece may be determined before arranging the workpiece on the stage. In example embodiments of the present invention, the position of the edge may be determined using an interferometer. In example embodiments of the present invention, the workpiece may be at least partly covered with a layer sensitive to electromagnetic radiation and the stage may be part of a pattern generator for patterning an arbitrary pattern onto the workpiece.

In example embodiments of the present invention, the position of the edge may be determined using a detector capable of detecting a change in property of a reflected laser beam.

DETAILED DESCRIPTION OF THE EXAMPLE EMBODIMENTS OF THE PRESENT INVENTION

The following detailed description is made with reference to the figures. Example embodiments are described to illustrate the example embodiments of the present invention, not to limit its scope, which is defined by the claims. Those of ordinary skill in the art will recognize a variety of equivalent variations on the description that follows.

Example embodiments of the present invention are described with reference to a laser as an edge-detecting source, however, it will be understood that sources other than lasers may be equally applicable; for example a sound emitting device, a heat-emitting device with appropriate detectors, or the like.

Example embodiments of the present invention relate to the alignment of a workpiece, for example, a semiconductor wafer or a mask substrate. A pattern may be created on the workpiece using any suitable type of radiation, for example, light from infra-red (IR) to extremely ultra violet (EUV), x-ray or particle beams (e.g., electron, ion or atom beams), or any other suitable type of radiation.

Figure 1:
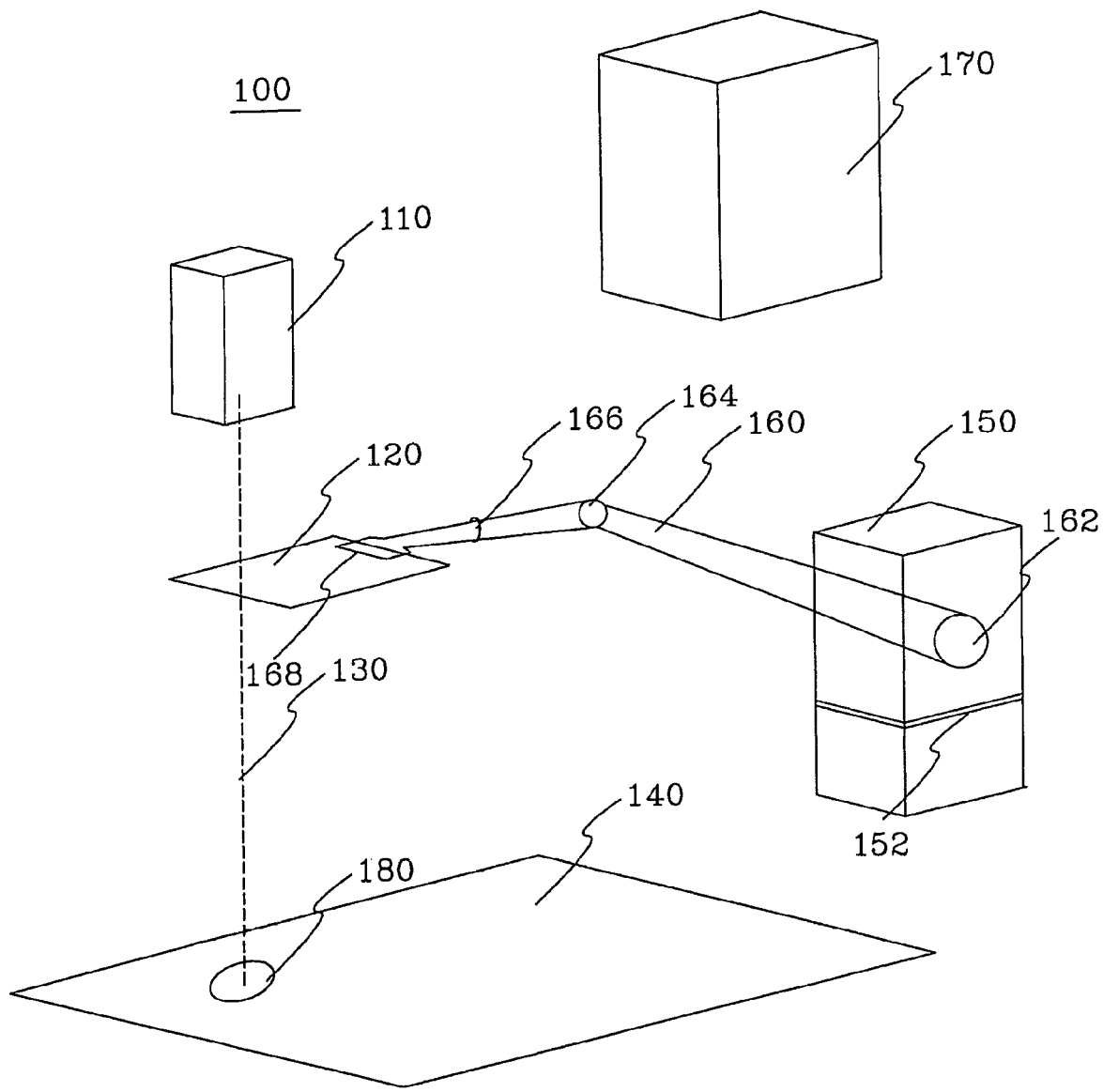
FIG. 1 depicts in a perspective view an example embodiment of an apparatus according to the present invention.

FIG. 1 shows an example apparatus for aligning a workpiece according to an example embodiment of the present invention. The example setup may comprise a laser source 110, a robotic device 150, a workpiece storage magazine 170, a stage 140, and a detector 180. The robotic device 150 may have an arm 160 rotatable at a connection point 162 and/or at points 164 and 166. The robotic device may be rotatable at 152 around a longitudinal axis. The points 162, 164, 166 and 152 may allow a workpiece to be placed at any position within reach of the arm 160. The robotic device 150 may be, for example, any kind of robotic device, which may be capable of picking and placing a workpiece.

The laser source may emit radiation, which may not affect a coating on top of the workpiece. The coating may be sensitive to electromagnetic radiation, for example, any type of photo resist.

The laser source 110 may be arranged in the pattern generator such that a detector 180 may receive an emitted radiation beam 130 from the laser source 110. The laser may be arranged above the stage 140 and the detector 180 may be integrated with the stage 140. However, the stage 140 and the detector 180 may be separate. Although example embodiments of the present invention use the detector 180 and the laser 110, any type of arrangement with similar, or substantially similar, capabilities may be used. Such an arrangement may be, for example, a retro-reflective mirror at the position of the detector and a detector arranged within the laser source. A position of the robotic device 150 in relation to the stage 140 may be known, and the stationary laser 110 and the detector 180 may be arranged outside the stage 140. The laser 110 and detector 180 may be arranged outside the stage 140, and the workpiece 120 may be put on the stage 140 at a position, for example, since a distance between the detector 180 and the stage 140 may be known.

The workpiece storage magazine 170 may store a workpiece or workpieces 120. The robotic device 150 may pick up at least one of the stored workpieces 120 and move the workpiece 120 towards the beam 130 of the laser 110. A gripper device 168 attached to the arm 160 of the robotic device 150 may be operated, for example, by vacuum action, for example, through the use of a suction device, however, any suitable gripper device capable of holding a workpiece may be used. For example, the gripper device 168 may be mechanical.

Figure 2A:
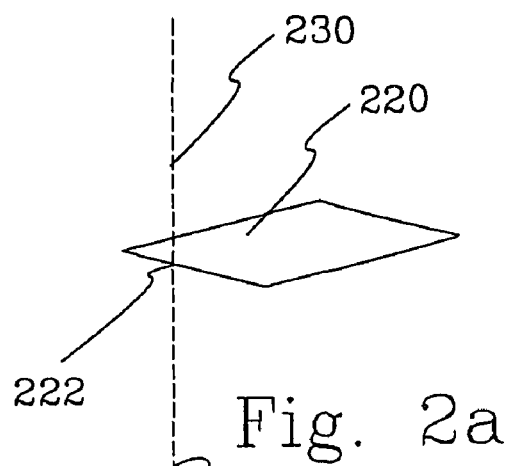
FIG. 2a depicts in a perspective view an example of a portion of the method according to an example embodiment of the present invention.

FIG. 2a illustrates an example of a first edge of the workpiece 220 intersecting the beam of the laser 230. The beam of the laser 230 may intersect an edge of the workpiece 220 at a point 222 and the position of the arm of the robotic device may be registered. That is, when little or no illumination impinges on the detector 280 the position of the arm may be registered. A drop in an intensity received by the detector may also be detected. A partial cutoff of the illumination may be detected and the position of the arm may be registered.

Figure 2B:
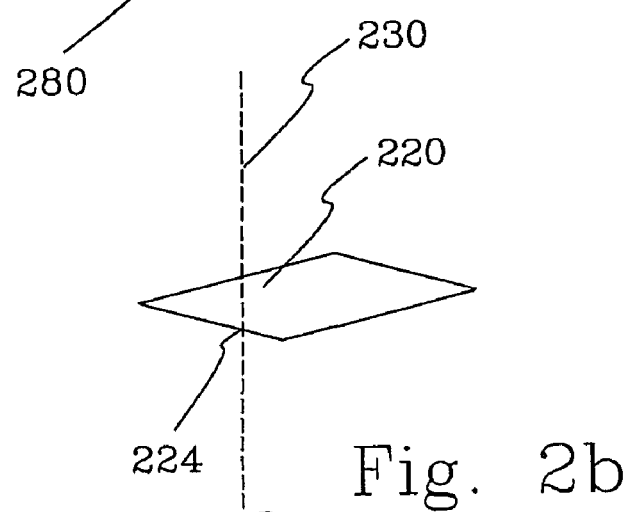
FIG. 2b depicts in a perspective view another example of another portion of the method according to an example embodiment of the present invention.

The position of the robotic arm may be registered, for example, when cutting the beam of the laser at least partially at point 222 of the edge of the workpiece 220, and the workpiece 220 may be displaced so that another part of the edge may intersect the same beam 230 of the same laser. FIG. 2b illustrates that the workpiece may cut the beam of the laser at point 224, for example, after the workpiece 220 may be displaced. The position of the robotic arm may be registered, for example, when the beam of the laser may be at least partially cut at the point 224. The shape, for example, rectangular, rhombic, triangular, circular, elliptical, or any other shape, of the workpiece 220 may be known, the displacement may be known, and a rotation of the workpiece 220 may be computed using the positions of the arm 160 of the robotic device 150, for example, when the workpiece 220 may intersect the beam at the points 222 and 224.

From the registered positions of the arm 160 of the robotic device 150 the laser may determine a position of the edge, which may include the points 222 and 224.

Figure 3:
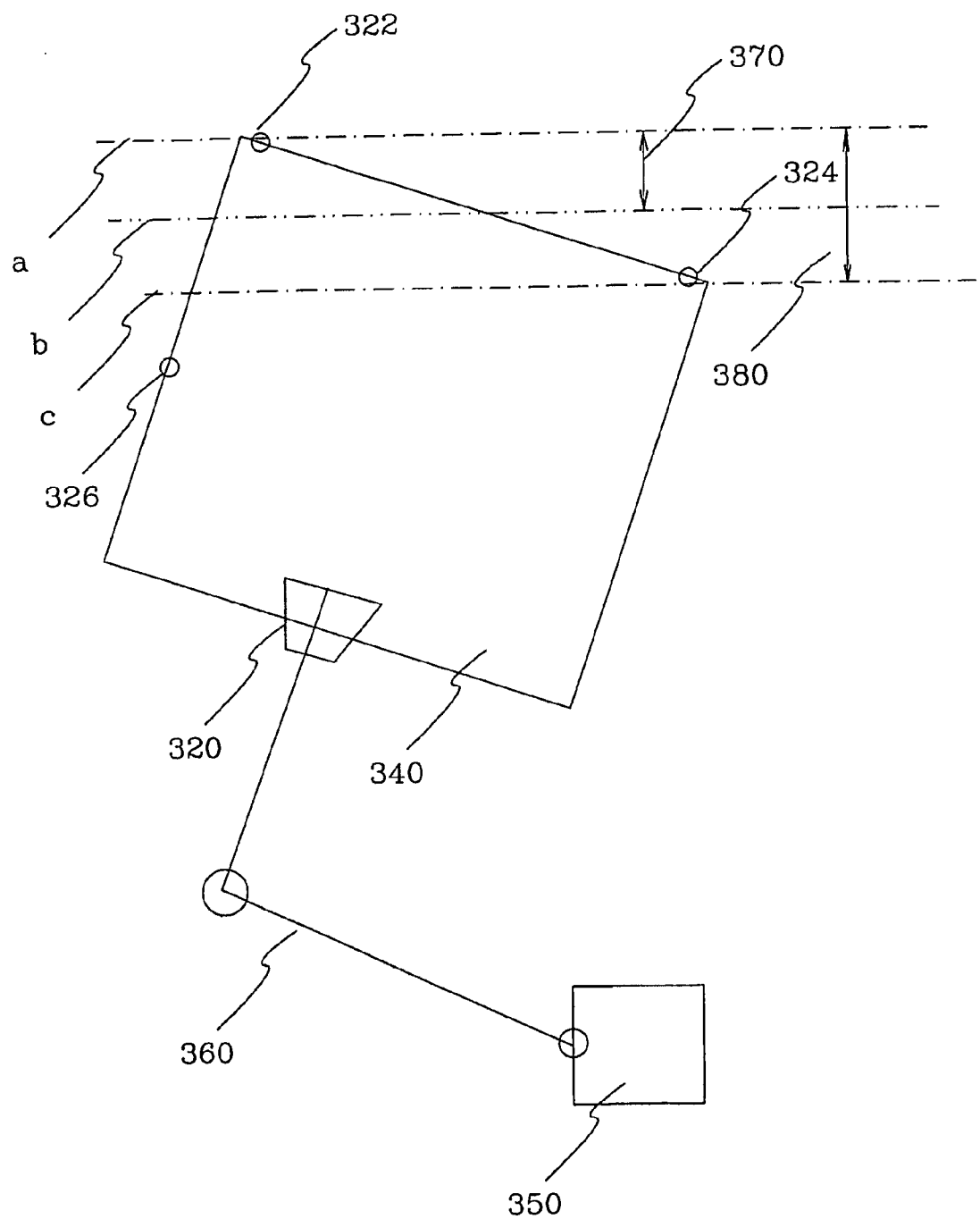
FIG. 3 depicts a top view of an example workpiece which may be aligned with a robotic device, according to an example embodiment of the present invention.

FIG. 3 illustrates an example of a top view of a workpiece 340, which may be aligned. Points 322 and 324 may be detected in the same, or substantially the same, manner as described above. The distance between the points 322 and 324 may be known, and may indicate a possible error of rotation of the workpiece.

Lines a, b, and c are shown in FIG. 3 for illustration purposes. Line a may go through point 322 and may be parallel, or substantially parallel, to a position of an edge, which may include the points 322 and 324. Line c may be parallel, or substantially parallel, to line a, and may go through point 324. Line b may be parallel, or substantially parallel, to line a and line c, and may go through the middle of the edge, which may include points 322 and 324.

If the workpiece is not rotationally aligned, the robotic device may detect a difference in distance, which may be indicated by 380 in FIG. 3. The error in rotation may be corrected by rotating the workpiece, for example, half of the detected distance 380 indicated by 370 in FIG. 3.

The position of the edge, that is, an alignment in a first direction of the workpiece, may be determined.

The arm of the robotic device may compensate for an error in rotation, and a new positioning of the workpiece may be checked, for example, by registering the position of the arm of the robotic device, for example, when the points 222 and 224, or any other two points located on the edge, may intersect the beam of the laser. A deviation in relation to an expected positioning of the robotic arm for the points 222 and 224 may be further compensated and/or checked again. More than two points may be detected and the accuracy of the computed error of rotation may increase. When two points are used, the points may be separated from each other along the edge of the workpiece, for example, as much as possible.

Figure 2C:
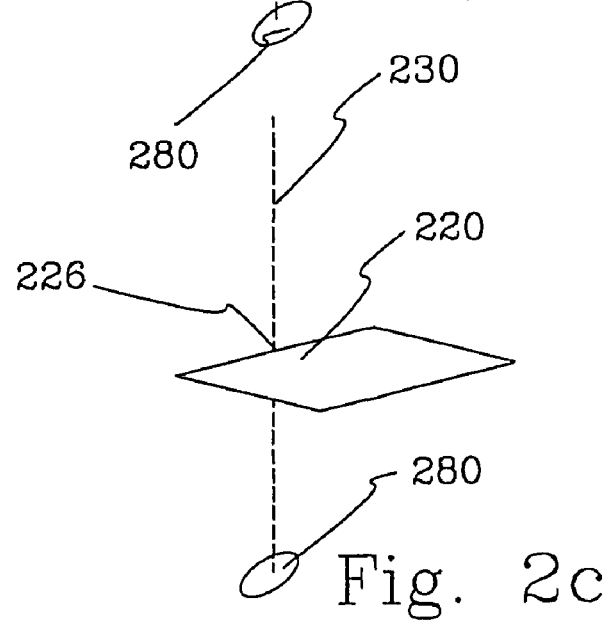
FIG. 2c depicts in a perspective view of another example of another portion of the method according to an example embodiment of the present invention.

By rotating the workpiece 90 degrees, the workpiece may be aligned in a direction orthogonal to the first direction, see FIG. 2c. If the workpiece has, for example, a rectangular shape, an edge of the workpiece orthogonal to the edge, which may include points 222 and 224, may be moved toward the beam of the laser. When the edge intersects the beam of the laser at least partially, a position of the edge may be determined by registering the position of the arm of the robotic device. An orientation of the workpiece in, for example, two orthogonal directions and the workpiece's rotation may be determined. By using the registered positions of the arm of the robotic device, the workpiece may be put at any location on the stage. A tilt alignment in addition to an alignment of the workpiece orthogonal, for example, a z-direction, to the two orthogonal directions, for example, an x- and a y-direction, respectively, may be determined using the stage according to well known techniques in the art.

If the workpiece has the shape of a semi-conducting wafer, for example, essentially circular with a crystal direction marked with a flat edge, the rotation of the workpiece, and the determination of the position of the edge (e.g., alignment in a first direction) may be performed in the same, or substantially the same, manner as described above.

For example, three measurements may be made at different positions along a circular section, the shape of the circular section may be determined, and the position of the circular section may be determined. When the shape is known, the position may be deduced from at least one of the measurements.

The alignment in the second direction may be performed, for example, after the workpiece has been placed on the stage. If the workpiece has, for example, a rectangular shape, an edge of the workpiece, orthogonal to the one already aligned, may be located using, for example, a camera (e.g., charge-coupled device (CCD) camera) while moving the stage. The edge may be located by illuminating the edge using the beam of the laser and detecting (e.g., simultaneously detecting) differences in reflectance of the beam. When the beam passes the edge, the reflected beam may be detected. That is, the difference of reflectance of the stage, the workpiece, and the slope of the edge of the workpiece may be detected. Using the laser, the mirror (e.g., retro-reflective mirror) and the detector within the laser alignment may be performed in the second direction.

If the workpiece has one flat edge, the camera may align the workpiece in, for example, at least one direction given that the workpiece may be rotationally aligned. Errors in alignment in the x-direction and/or y-direction may be compensated by moving the stage on top of which the workpiece may be attached.

Aligning the workpiece at least rotationally, using the robotic device, for example, before placing the workpiece on the stage, may reduce the need for alignment of the workpiece on the stage, and a stage movable in an x-direction and y-direction may be used.

If the workpiece is aligned in one or more directions (e.g. two), x and y respectively, for example, before being attached to the stage, alignment performed while on stage may be reduced.

Example embodiments of the aligning method according to the present invention may be useful in lithography, for example, where a workpiece may be aligned prior to patterning. The alignment may become increasingly important as the line widths decrease in size. Example embodiments of the present invention may be applicable in other technical areas, for example, where an object need be arranged prior to processing. For example, different cutting techniques such as with lasers, drilling, punching, etc.

The robotic device 150 may be in a position (e.g., fixed position) relative to the stage 140 of the pattern generator and/or movable back and forth relative to the stage 140. The distance between the robotic device 150 and the stage may be monitored (e.g., constantly monitored), for example, using techniques well known in the art, such as using an interferometer, a sound wave, or any other suitable device.

While the example embodiments of the present invention describe a method, devices and systems employing this method may be understood. A magnetic memory, which may contain a program capable of practicing the example embodiments of the method according to the present invention may be one such device. A computer system having memory loaded with a program practicing the example embodiments of the method according to the present invention may be another such device.

Although example embodiments of the present invention have been described with regard to a CCD camera, it will be understood that any suitable camera device may be used.

While the present invention has been discussed with reference to the example embodiments and examples described herein above, it is understood that these examples and example embodiments are intended in an illustrative rather than limiting. It will be understood that modifications and/or combinations will readily occur to those skilled in the art, all of which will be within the spirit of the invention and the scope of the following claims.

The invention claimed is:

1. A method for aligning a workpiece, the method comprising:
   detecting a first and second position of a first edge of the workpiece based on a first and a second position of a pickup device; and
   aligning the workpiece based on the first and second positions of the pickup device; wherein
      the first and second positions of the pickup device are detected based on intersections of a laser beam and the workpiece, and
      the detecting and aligning are performed during fetching of the workpiece by the pickup device.

2. The method of claim 1, wherein the detecting the first position further includes,
   fetching the workpiece,
   moving the workpiece in a first direction toward the laser beam, and
   registering the position of the pickup device when the first edge of the workpiece is at least partly breaking the laser beam.

3. The method of claim 1, wherein the detecting of the second position further includes,
   displacing the workpiece,
   moving the workpiece in a direction toward the laser beam,
   detecting with a detector when the second edge of the workpiece is at least partly breaking the laser beam, and
   registering the position of the pickup device when the second edge of the workpiece is at least partly breaking the laser beam.

4. The method of claim 1, wherein the aligning of the workpiece further includes,
   computing an angle error of the workpiece based on the at least first second and third positions,
   correcting the angle error of the workpiece, and
   placing the workpiece onto a stage.

5. The method according to claim 1, wherein the workpiece is aligned in at least one of an x and y direction while being arranged on a stage.

6. The method according to claim 5, wherein the alignment of the workpiece in at least one of the x and y direction is performed by detecting a position of the workpiece using a camera and moving the workpiece into a position using the stage.

7. The method according to claim 1, wherein the positions of the first edge and the second edge are detected by detecting an edge using an edge detector, while the workpiece is supported by a stage and moving the workpiece into a position using the stage.

8. The method according to claim 7, wherein the edge detection is performed using a detector which is capable of detecting a change in property of a reflected laser beam when passing at least one of the first and second edges, while the workpiece is supported by the stage.

9. The method according to claim 4, wherein the stage is movable in at least one of an x and y direction.

10. A method for aligning a workpiece, the method comprising:
    detecting a first and second position of a first edge of the workpiece based on a first and a second position of a pickup device;
    detecting a first position of a second edge of the workpiece based on a third position of the pickup device; and
    aligning the workpiece based on the first, second, and third positions of the pickup device; wherein
       the first, second, and third positions of the pickup device are detected based on intersections of a laser beam and the workpiece, and
       the first, second, and third positions of the pickup device are detected, and the aligning is performed, while the workpiece is fetched by the pickup device.

11. The method of claim 10, wherein the detecting the first position further includes,
    fetching the workpiece,
    moving the workpiece in a first direction toward the laser beam, and
    registering the position of the pickup device when the first edge of the workpiece is at least partly breaking the laser beam.

12. The method of claim 10, wherein the detecting of the second position further includes,
    displacing the workpiece,
    moving the workpiece in a direction toward the laser beam,
    detecting with a detector when the second edge of the workpiece is at least partly breaking the laser beam, and
    registering the position of the pickup device when the second edge of the workpiece is at least partly breaking the laser beam.

13. The method of claim 10, wherein the detecting of the first position of the second edge further includes,
    rotating the workpiece;
    moving the workpiece in a second direction toward the laser beam;
    detecting with the detector when the first position of a second edge of the workpiece is at least partially intersecting the laser beam;
    registering the position of the robotic arm when the first position of the second edge of the workpiece is at least partially breaking the laser beam.

14. The method of claim 10, wherein the aligning of the workpiece further includes,
    computing a position of the first edge;
    correcting an angle error of the workpiece;
    computing a position of the second edge; and
    placing the workpiece onto a stage with the first and second edges are at positions.

15. The method of claim 10, wherein the laser beam has a wavelength does not affect material sensitive to electromagnetic radiation.

16. The method according to claim 13, wherein the workpiece is rotated 90°.

17. A method for aligning a workpiece, the method comprising:
fetching the workpiece;
aligning the workpiece rotationally in a plane of a surface of the workpiece before arranging the workpiece on a stage;
arranging the workpiece on the stage;
aligning the workpiece in at least one of an x and y direction while being arranged on the stage.

18. The method according to claim 17, wherein the rotational alignment is performed by detecting two spaced apart positions on a common edge of the workpiece.

19. The method according to claim 18, further including, determining a position of another edge of the workpiece before arranging the workpiece on the stage.

20. The method according to claim 17, wherein the position of an edge of the workpiece is determined using an interferometer.

21. The method according to claim 18, wherein the position of the edge is determined using an interferometer.

22. The method according to claim 17, wherein the workpiece is at least partly covered with a layer sensitive to electromagnetic radiation and the stage is part of a pattern generator for patterning an arbitrary pattern onto the workpiece.

23. The method according to claim 17, wherein the position of an edge of the workpiece is determined using a detector capable of detecting a change in property of a reflected laser beam.

24. An apparatus for aligning a workpiece, the apparatus comprising:
a laser adapted to irradiate the laser beam;
a detector for detecting when positions of at least one edge of the workpiece is at least partially intersecting the laser beam while the workpiece is fetched by a robotic arm, the robotic arm for moving the workpiece in at least one direction and placing the workpiece on a stage; and
a computer; wherein the computer is adapted to,
register positions of the robotic arm when the positions of the at least one edge of the workpiece at least partially intersect the laser beam,
compute an angle error of the workpiece based on registered positions of the robotic arm,
correct the angle error of the workpiece using the robotic arm, and
compute a position of the stage based on the registered positions of the robotic arm.

25. An apparatus for performing the method of claim 1.

26. An apparatus for performing the method of claim 10.

27. An apparatus for performing the method of claim 17.

28. A method for aligning a workpiece, the method comprising:
determining a first and second position of a first edge of the workpiece based on a first and a second position of a pickup device; and
aligning the workpiece based on the first and second positions of the pickup device; wherein
the first and second positions of the pickup device are determined based on intersections of a laser beam and the workpiece.

* * * * *